United States Patent [19]

Zumoto et al.

[11] Patent Number: 5,355,194
[45] Date of Patent: Oct. 11, 1994

[54] OPTICAL PROCESSING APPARATUS

[75] Inventors: Nobuyuki Zumoto; Toshinori Yagi; Yasuhito Myoi; Teruo Miyamoto; Masaaki Tanaka; Masao Izumo, all of Amagasaki, Japan

[73] Assignee: Mitsubishi Denki Kabushiki Kaisha, Tokyo, Japan

[21] Appl. No.: 888,782

[22] Filed: May 27, 1992

[30] Foreign Application Priority Data

| May 30, 1991 | [JP] | Japan | 3-127433 |
| Nov. 18, 1991 | [JP] | Japan | 3-301752 |
| Mar. 24, 1992 | [JP] | Japan | 4-065886 |

[51] Int. Cl.$^5$ .............................................. G02B 17/00
[52] U.S. Cl. ........................................ 355/53; 355/67; 355/71; 346/108
[58] Field of Search ............................ 355/53, 71, 67; 346/108

[56] References Cited

U.S. PATENT DOCUMENTS 5,040,882 8/1991 Markle .............................. 359/727

FOREIGN PATENT DOCUMENTS 220991 9/1988 Japan .

OTHER PUBLICATIONS

Direct Letterpress Platemaking by XeF Excimer Laser pp. 563(39)–567(43) of Magasin "Optics" vol. 11, No. 6.
Metal Film Removal and Patterning Using a XeCl Laser Appln. Phys. Lett 43 (11) Dec. 1983.

Primary Examiner—Michael L. Gellner
Assistant Examiner—D. P. Malley
Attorney, Agent, or Firm—Sughrue, Mion, Zinn, Macpeak and Seas

[57] ABSTRACT

An optical processing apparatus utilizing multiple reflections of a light beam between a mask and a reflector has improved uniformity in the distribution of the light beam over a surface of the mask. In one form, the reflector is disposed in a face-to-face relation with respect to the mask with an angle of inclination relative thereto. In another form, the reflector has a flat or curved taper surface for decreasing an angle of reflection of the light beam at the mask surface at an initial stage, and a flat surface disposed in parallel with the mask surface. In a further form, the reflector is curved in a direction of transmission of the light beam. In a yet further form, an angle of incidence of the light beam is properly adjusted such that a portion of the light beam, which is first reflected from the mask and escapes outwardly from the reflector, is minimized.

12 Claims, 10 Drawing Sheets

LOCATION ON THE MASK SURFACE

OPTICAL PROCESSING APPARATUS

BACKGROUND OF THE INVENTION

The present invention relates to an optical processing apparatus such as, for example, one for forming via holes in a printed circuit board by means of a light beam such as a laser beam through masking.

FIG. 15 illustrates a typical example of such an optical processing apparatus. In this figure, a mask, which is generally designated at reference numeral 1, includes a transparent plate or board is formed of synthesized quartz or the like, and a reflecting or masking portion 1c having a high reflection factor and placed on a surface of the transparent board 1a with a circuit pattern of a predetermined configuration provided thereon through the reflecting portion 1c. The reflecting portion 1c is formed, for example, of a thin aluminum film or the like which is vapor deposited on the surface of the transparent board 1a while leaving a circuit pattern 1b thereon through which a beam of light 3 in the form of a laser beam can pass toward a substrate 5 which is disposed behind the mask 1 at a predetermined distance therefrom. A reflector 2 is disposed at a predetermined distance from the mask 1 in a direction of incident light and in a parallel relation with respect thereto for reflecting light beams reflected from the reflecting film 1c. An optical focusing system 4 such as a convex lens is also disposed at a distance from the mask between the mask 1 and the substrate 5.

In operation, as illustrated in FIG. 15, a portion of a laser beam 3 first irradiated on the mask 1 through an adjacent or upper edge of the reflector 2 passes directly through the non-masked portion 1b of the circuit pattern and the transparent board 1a to be utilized for optically processing the substrate 5 disposed behind the convex lens 4, whereas the remaining portion of the incident laser beam 3 is reflected at the reflecting film 1c on the surface of the transparent board 1a toward the reflector 2. The remaining portion of the laser beam 3 thus reflected from the reflecting film 1c is again reflected at the surface of the reflector 2 toward the mask 1. In this regard, the laser beam 3 is initially incident on the mask 1 at a predetermined angle relative to the normal or perpendicular line with respect to the surface of the mask 1, so that the laser beam 3 once reflected from the surface of the reflector 2 arrives at a second location deviated from a first location on the mask 1 to which the laser beam 3 is initially incident. That is, the second location is deviated from the first location by a certain distance in a downward direction in FIG. 15. Thereafter, such a process is repeated a number of times until the reflected laser beam 3 finally comes to an opposite or lower edge of the mask 1 and escapes outwardly therefrom. During the repeated reflections, the laser beam 3 once having passed through the non-masked or pattern portion 1b in the reflecting or masking film 1c is focused on a surface of the substrate 5 under the action of the convex lens 4, whereby the surface of the substrate 5 is optically processed by the laser beam 3 to provide a circuit pattern thereon which corresponds to the non-masked circuit pattern 1b on the surface of the transparent board 1a. In this manner, a portion of the laser beam 3 incident to the surface of the reflecting film 1c on the transparent board 1a is repeatedly reflected between the parallel-disposed reflecting film 1c and reflector 2 and hence it is repeatedly reused a number of times for enhancing the total efficiency of the laser beam 3. This enables as large an area of the substrate 5 as possible to be processed by a fixed amount of laser beam without increasing the laser power.

With the above-described optical processing apparatus, however, the strength or magnitude of the reflected laser beam 3 repetitively reflected between the reflecting film 1c and the reflector 2 is distributed non-uniformly over the surface of the mask 1, and there is a considerable portion of the reflected laser beam escaping outward from between the mask 1 and the reflector 2, thus resulting in non-uniformity in processing the substrate 5 and in reduction in the efficiency of available laser energy. A more detailed explanation of this will be given below.

FIGS. 16 and 17 illustrate how the laser beam 3 repetitively reflected between the mask 1 and the reflector 2 travels. FIG. 16 is a perspective view showing the state in which the mask 1 is placed on an x-y plane with the x axis oriented in a direction in which the laser beam 3 proceeds. FIG. 17 is a cross sectional view looking at FIG. 16 in the direction of the x axis from the front to the back of the drawing sheet. FIG. 18 illustrates the distribution of the strength or magnitude of the laser beam 3 over a surface of the mask 1 in the x-axis direction. In fact, as the laser beam 3 is travelling while being repetitively reflected between the two parallel reflecting surfaces 1, 2, the strength or magnitude of the laser beam 3 gradually decreases. In particular, this tendency becomes more remarkable as the rate of opening of the mask 1 (i.e., the rate of an opening area of the mask 1, against which the incident laser beam 3 directly impinges, to the total area of the mask 1) or the angle of incidence of the laser beam 3 increases. As a result, as shown in FIG. 18, the strength or magnitude of the reflected laser beam at the surface of the reflecting film 1c decreases as it proceeds from the upper edge to the lower edge of the mask 1, thus resulting in irregular or non-uniform distribution of the energy density. In addition, as can be clearly seen from FIG. 17, the total width (i.e., the length in the y-axis direction perpendicular to the x-axis direction) of the laser beam 3 gradually increases as the laser beam 3 proceeds while being reflected between the mask 1 and the reflector 2, so that a portion of the reflected laser beam 3 finally leaks or escapes outwardly of the mask 1 and can not be reused for optical processing, thus reducing the efficiency or the rate of utilization of the laser beam 3. As a result, the distribution in the strength or magnitude of the laser beam 3 over the surface of the mask 1 in the y-axis direction becomes non-uniform.

Moreover, FIGS. 19 and 20 illustrate the distributions of the strength of the laser beam 3 over the surface of the mask 1 with a relatively large angle of incidence $\theta_0$ and a relatively small angle of incidence $\theta_0$, respectively, of the laser beam. As can be seen from these figures, the strength of the laser beam 3 is greater with the small incident angle than with the large incident angle. In this case, however, as illustrated in FIGS. 21 through 23 which illustrate how the laser beam 3 is incident to the mask 1 and initially reflected therefrom, the laser beam 3 has a tendency to spreads or widen as it proceeds, so an increasing portion of the laser light 3, which is once reflected from the mask 1 and proceeding to the reflector 2, escapes or leaks from an edge of the reflector 2 in accordance with the decreasing angle of incidence. In FIG. 21, the incident laser beam and the reflected laser beam are depicted concurrently in a superposed fashion but by different hatching, whereas they are individually depicted in FIGS. 22 and 23, respectively. It is evident from FIG. 23 that a portion of the laser beam 3 initially reflected from the mask 1 leaks from an edge of the reflector 2, thus resulting in an energy loss.

SUMMARY OF THE INVENTION

Accordingly, the present invention aims at overcoming the above-described problems encountered with the known optical processing apparatus.

An object of the present invention is to provide a novel and improved optical processing apparatus which is able to make the magnitude or strength of a light beam, which is reflected between a mask and a reflector a multiplicity of times, uniformly distributed over the entire surface of the mask.

Another object of the invention is to provide a novel and improved optical processing apparatus which is able to minimize an energy loss of the laser beam from between the mask and the reflector for improved efficiency in utilization thereof.

In order to achieve the above objects, according to one aspect of the invention, there is provided an optical processing apparatus comprising: a light source for generating a beam of light; optical focusing means for focusing the light beam from the light source on an object for optically processing it; a mask disposed at a location between the light source and the optical focusing means and having a reflecting portion for reflecting a portion of the light beam from the light source and a light transmitting portion for allowing the passage therethrough of the remaining portion of the light beam toward the optical focusing means; and a reflector disposed in a spaced face-to-face relation with respect to the mask at one side thereof near the light source and having a reflecting surface for reflecting the portion of the light beam, which is reflected from the reflecting portion of the mask, back to the mask, the reflecting surface of the reflector being disposed at an angle of inclination relative to a plane parallel to the reflecting portion of the mask.

With the inclined disposition of the reflecting surface of the reflector with respect to the reflecting portion of the mask, the density of the light beam reflected between the mask and the reflector gradually increases as it transmits therethrough, whereby the strength or magnitude of the laser beam can be distributed substantially uniformly over the entire surface of the mask.

Preferably, the reflector is disposed such that the distance between the reflecting surface of the reflector and the reflecting portion of the mask gradually decreases in a direction in which the light beam incident from the light source to the mask transmits in a space defined between the reflector and the mask while being reflected therebetween.

According to another aspect of the invention, there is provided an optical processing apparatus comprising: a light source for generating a beam of light; optical focusing means for focusing the light beam from the light source on an object for optically processing it; a mask disposed at a location between the light source and the optical focusing means and having a reflecting portion for reflecting a portion of the light beam from the light source and a light transmitting portion for allowing the passage therethrough of the remaining portion of the light beam toward the optical focusing means; and a reflector disposed in a spaced face-to-face relation with respect to the mask at one side thereof near the light source and having a reflecting surface for reflecting the light beam, which is reflected from the reflecting portion of the mask, back to the mask, the reflecting surface of the reflector including a major parallel portion which is disposed in parallel with respect to the reflecting portion of the mask, and a tapered portion which is connected with the major parallel portion and which is disposed at an angle of inclination relative to a plane parallel to the reflecting portion of the mask.

Due to the tapered portion of the reflector, the number of reflections of the light beam by the mask and the reflector increases to enhance the density of the light beam over the mask surface, thus improving the efficiency in utilization of the light beam.

Preferably, the tapered portion of the reflector is disposed such that the distance between the tapered portion and the reflecting portion of the mask gradually decreases in a direction in which the light beam incident from the light source to the mask transmits in a space defined between the reflector and the mask while being reflected therebetween.

According to a further aspect of the invention, there is provided an optical processing apparatus comprising: a light source for generating a beam of light; optical focusing means for focusing the light beam from the light source on an object for optically processing it: a mask disposed at a location between the light source and the optical focusing means and having a reflecting portion for reflecting a portion of the light beam from the light source and a light transmitting portion for allowing the passage therethrough of the remaining portion of the light beam toward the optical focusing means; and a reflector disposed in a spaced face-to-face relation with respect to the mask at one side thereof near the light source and having a reflecting surface for reflecting the portion of the light beam, which is reflected from the reflecting portion of the mask, back to the mask, the reflecting surface of the reflector being curved in a direction perpendicular to a direction of transmission of the light beam in which the light beam incident from the light source to the mask transmits in a space defined between the reflector and the mask while being reflected therebetween.

Due to the curved reflecting surface of the reflector, the light beam, which is being repeatedly reflected between the mask and the reflector, is suppressed from expanding or spreading in a direction perpendicular to the direction of transmission of the light beam between the mask and the reflector. This serves to maintain the strength of the reflected light beam substantially uniform during transmission thereof between the mask and the reflector.

Preferably, the curved reflecting surface of the reflector has a predetermined radius of curvature R which is equal to or greater than the shortest distance between the reflector and the mask.

According to a yet further aspect of the invention, there is provided an optical processing apparatus comprising: a light source for generating a beam of light; optical focusing means for focusing the light beam from the light source on an object for optically processing it; a mask disposed at a location between the light source and the optical focusing means and having a reflecting portion for reflecting a portion of the light beam from the light source and a light transmitting portion for allowing the passage therethrough of the remaining portion of the light beam toward the optical focusing means; a reflector disposed in a spaced face-to-face relation with respect to the mask at one side thereof near the light source and having a reflecting surface for reflecting the portion of the light beam, which is reflected from the reflecting portion of the mask, back to the mask; and means for adjusting an angle of incidence of the light beam coming from the light source to the mask in such a manner that a portion of the light beam, which is first reflected from the mask and escapes outwardly from the reflector, is minimized.

Preferably, an angle of incidence $\theta_0$ of the light beam coming from the light source to the mask is given as follows:

$$\theta_0 = (W_0 + W_1)/4d$$

where $W_0$ is the thickness of the light beam incident to the mask in a direction of transmission of the light beam in which the light beam coming from the light source to the mask transmits in a space defined between the reflector and the mask while being reflected therebetween; $W_1$ is the thickness of light beam at the reflecting surface of the reflector once reflected from the mask in the direction of transmission of the light beam; and d is the distance between the reflector and the mask.

With the above arrangement, most of the incident light beam initially reflected from the mask can be directed toward the reflecting surface of the reflector without escaping from an edge of the reflector at which the light beam is incident to the mask. This serves to minimize an energy loss of the light beam due to its initial reflection from the mask.

The above and other objects, features and advantages of the invention will be more readily apparent from the ensuing detailed description of preferred embodiments of the invention taken in conjunction with the accompanying drawings.

BRIEF DESCRIPTION OF THE INVENTION

FIG. 5 is a schematic view, similar to FIG. 1, but showing a typical example of an optical processing apparatus;

Figure 19:
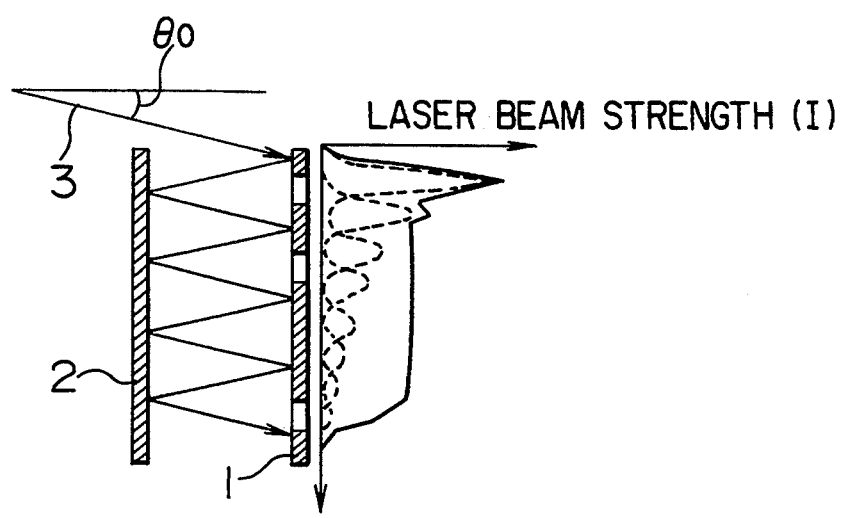
FIG. 19 illustrates the distribution of the strength of a laser beam reflected between the mask and the reflecting mirror of FIG. 16 over the surface of the mask with a relatively large angle of incidence of the laser beam.
Figure 20:
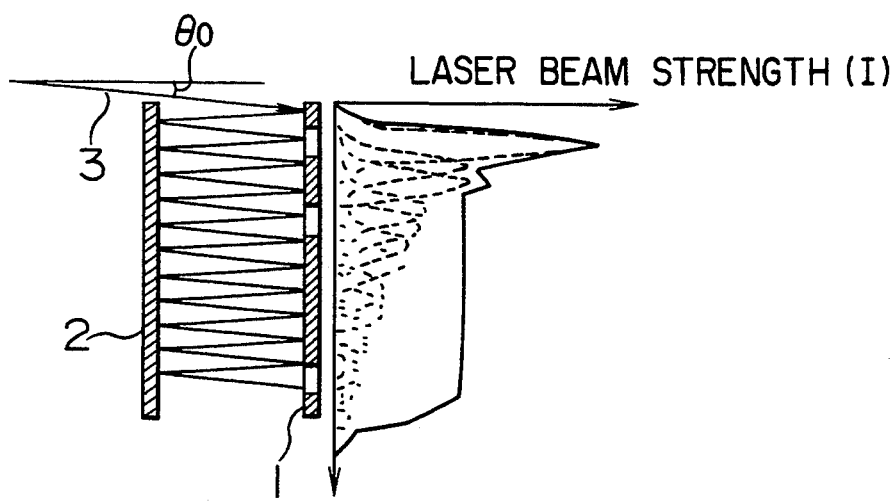
Figure 21:
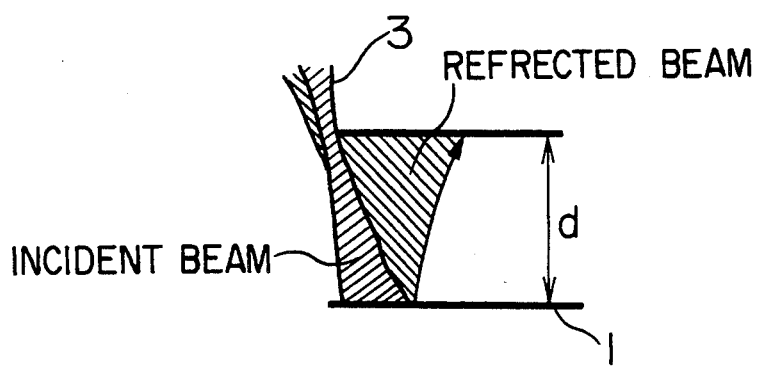
Figure 22:
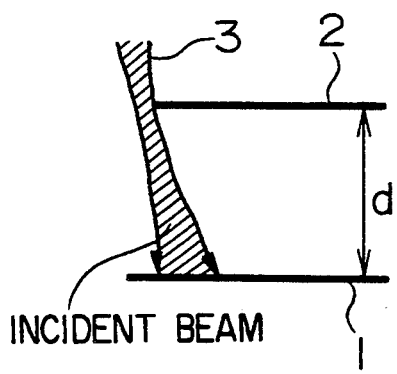
Figure 22:
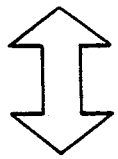
Figure 23:
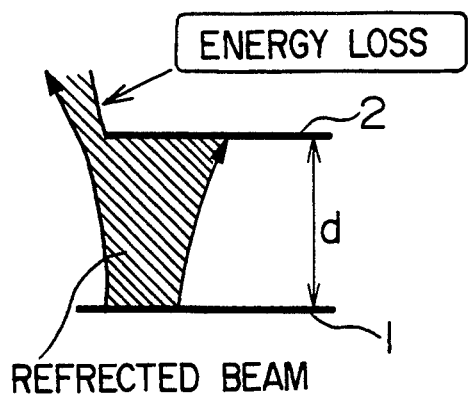

FIG. 20 is a view similar to FIG. 19, but showing another case in which a laser beam is irradiated on a mask with a relatively small angle of incidence; and FIGS. 21 through 23 illustrates the behavior of a laser beam incident to and reflected from a mask; in which FIG. 21 schematically illustrates a combination of an incident laser beam and a reflected laser beam superposed on the former; FIG. 22 illustrates the incident laser beam; and FIG. 23 illustrates the reflected laser beam.

DESCRIPTION OF THE PREFERRED EMBODIMENTS

Preferred embodiments of the invention will now be described in detail while referring to the accompanying drawings.

Figure 1:
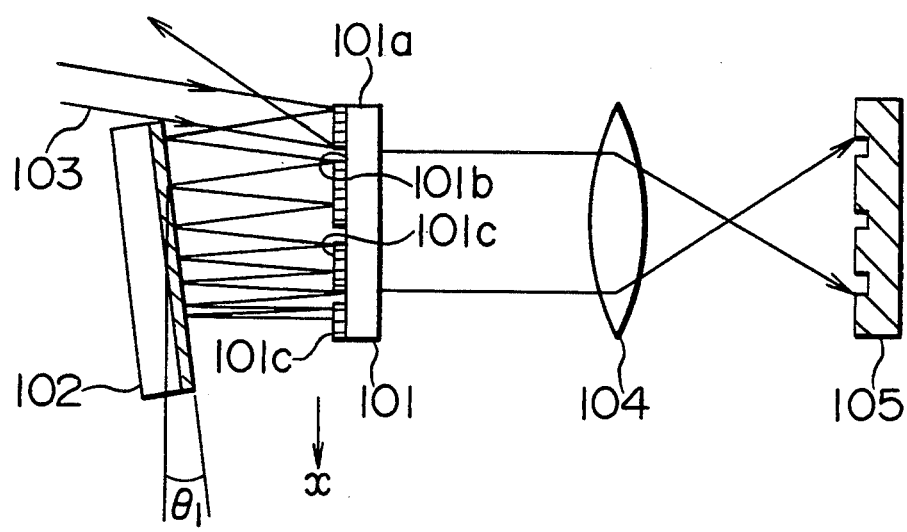
FIG. 1 is a schematic perspective view of major portions of an optical processing apparatus in accordance with a first embodiment of the invention.

Referring to the drawings and first to FIG. 1, major portions of an optical processing apparatus in accordance with a first embodiment of the invention are schematically illustrated. This embodiment includes a mask 101 comprising a transparent board 101a and a reflecting or masking film 101c having a predetermined circuit pattern 101b formed therethrough, a reflector or reflecting member 102, an optical focusing system 104 in the form of a lens, and a substrate 105 to be processed, all of which, except for the reflector 102, are constructed and arranged substantially in the same manner as in the previously described apparatus of FIG. 15.

Figure 15:
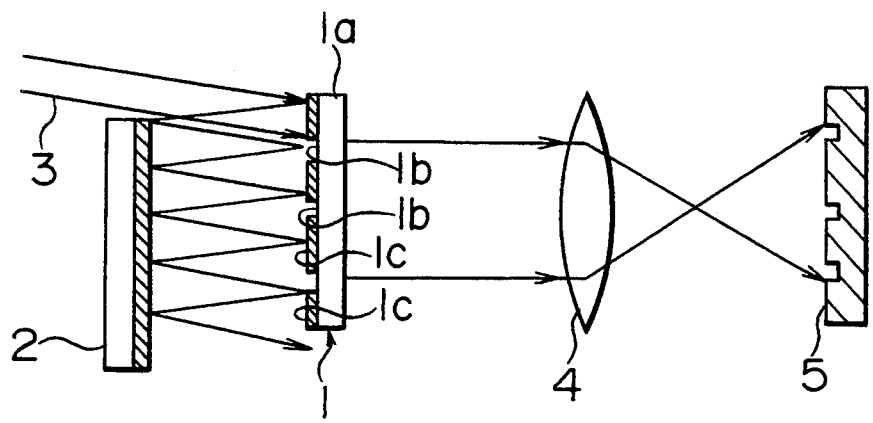
Figure 16:
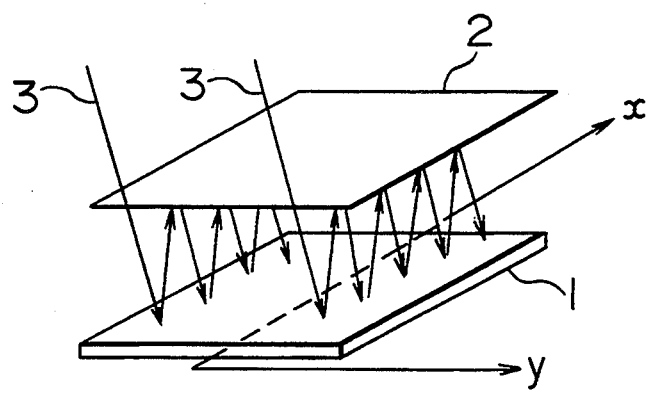
FIGS. 16 and 17 are a perspective view and a cross sectional view, respectively, of parts of the apparatus of FIG. 15, showing the operation thereof.
Figure 17:
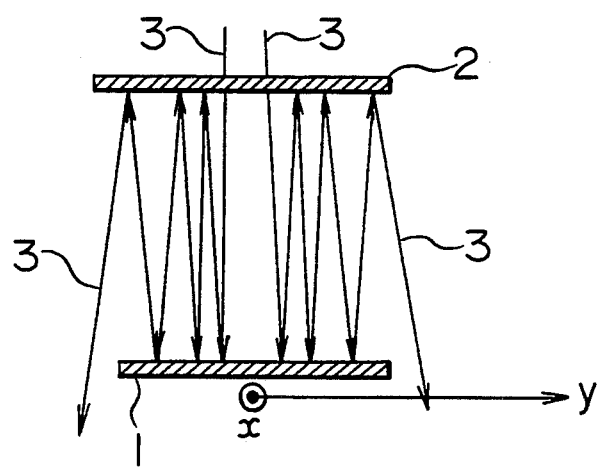

In this embodiment, the reflector 102 having a mirror or reflecting surface is disposed at a predetermined distance from the mask 101, which is of the same construction as that of the mask 1 of FIG. 15, in a face-to-face relation with respect to the mask 101 at an angle $\theta_1$ relative to a reflecting surface of the mask 101 so as to confine a light beam 103 in the form of a laser beam, which comes from behind the reflector 102 to the reflecting surface of the mask 101, within a space defined between the mask 101 and the reflector 102 to improve the efficiency or performance of the laser beam 103. Namely, the mirror surface of the reflector 102 is inclinedly disposed so that the distance between the opposed surfaces of the mask 101 and the reflector 102 gradually decreases in a direction of transmission of the laser beam 103, designated by arrow x in FIG. 1, in which the laser beam 103 transmits or proceeds between the mask 101 and the reflector 102. As a result, the angle of reflection of the laser beam 103, which is defined as an angle included by the light axis of a reflecting laser beam 103 and the normal to the reflecting surfaces of the mask 101 and the reflector 102, decreases as the laser beam 103 transmits or proceeds, whereby the density per unit area of the laser beam 103 at the surface of the mask 101 accordingly increases. Thus, the strength or magnitude of the laser beam 103 can be made substantially uniform along the longitudinal length of the mask 101 in the direction of transmission of the laser beam 103 except for an initial short area near the point of incidence of the laser beam 103, as clearly seen from FIG. 2.

More specifically, an optimal value for the angle of inclination of the reflector 102, which makes the strength or magnitude of the laser beam 103 substantially constant or uniform over the longitudinal length of the mask 101 (i.e., in the direction of transmission of the laser beam 103), is determined in the following manner.

Figure 3:
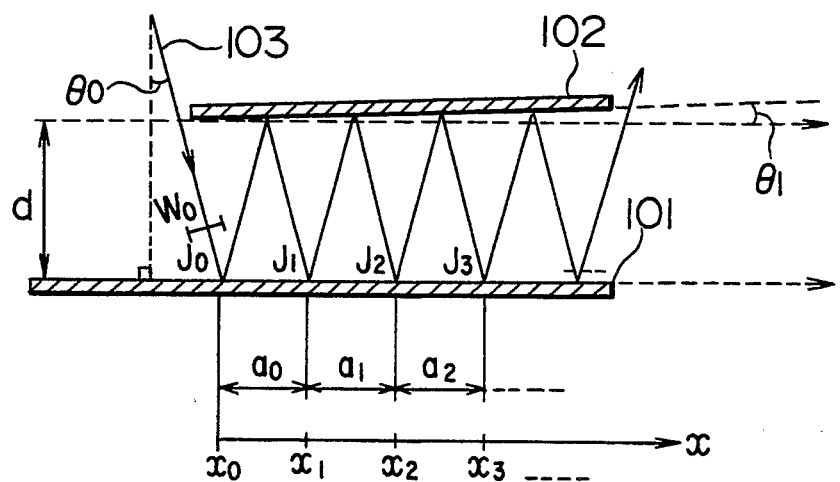
FIG. 3 is a schematic cross sectional view showing the principles of the invention as embodied in the FIG. 1 embodiment.

First, as shown in FIG. 3, the energy density I(Xn) (mJ/cm$^2$) of the laser beam 103 at a location Xn on the surface of the mask 101 is given as follows:

$$I(Xn) = Jn \times W_0/8_a \tag{1}$$

where Jn is the energy density (mJ/cm$^2$) of the laser beam 103 reaching the surface of the mask 101 while being repetitively reflected between the mask 101 and the reflector 102; $a_n$ is the distance between adjacent locations Xn+1, Xn on the mask surface at which the laser beam 103 reflected from the mirror surface of the reflector 102 reaches the mask surface ($a_n = Xn+1 - Xn$); and $W_0$ is the thickness of the laser beam 103. In addition, the energy density Jn and the locations Xn, X$_0$ are given by the following formulae, respectively:

$$Jn = (Rr \times Rm)^a \times J_0 \tag{2}$$

$$Xn \approx 2d \times \sum_{m=1}^{n} \{\theta_0 + (2m - 1) \times \theta_1\} \tag{3}$$

$$X_0 = 0 \tag{4}$$

From the above, the energy density I [mJ/cm$^2$] is given below with the assumption that $\theta_0$ and $\theta_1$ are small enough:

$$I(Xn) = [(Rr \times Rm)n/2d(\theta_0 + (2n+1)\theta_1)]J_0W_0 \tag{5}$$

Applying the condition [I(X$_0$)=I(Xn)] for making the energy density I uniform to equation (5) above, $\theta_1$ is given by the following equation:

$$\theta_1 = \theta_0[(Rr \times Rm)^n - 1]/[2n + 1 - (Rr \times Rm)^n] \tag{6}$$

Considering that the reflection factors R$_r$ and R$_z$ are both less than 1, it is seen from equation (6) above that the angle of inclination $\theta_1$ is of a negative value. In other words, though FIG. 3 illustrates the situation in general terms, it is seen from equation (6) above, which gives $\theta_1$ for making the energy density I uniform, that $\theta_1$ is negative. Therefore, in this case, the reflector 102 is disposed such that it falls or descends in the direction of transmission of the laser beam 103, i.e., from the left end to the right end in FIG. 3, which is just opposite the situation depicted in FIG. 3. In other words, the distance between the mask 101 and the reflector 102 increases in the direction of transmission of the laser beam 103, i.e., from the left to the right in FIG. 3.

Figure 2:
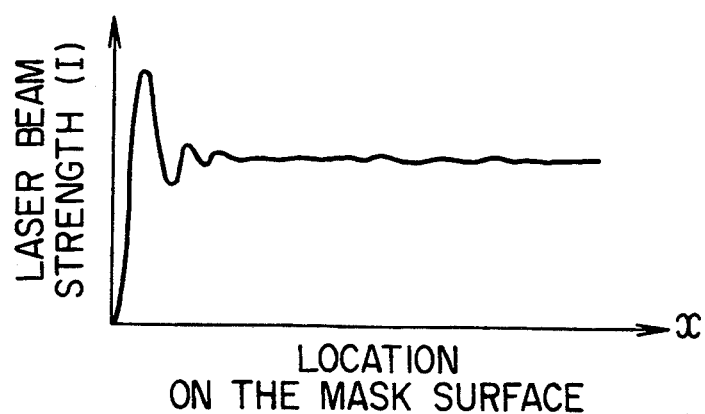
FIG. 2 is a graphical representation showing the distribution of a laser beam reflected between a mask and a reflecting mirror of FIG. 1 over a surface of the mask along an X-axis direction.
Figure 18:
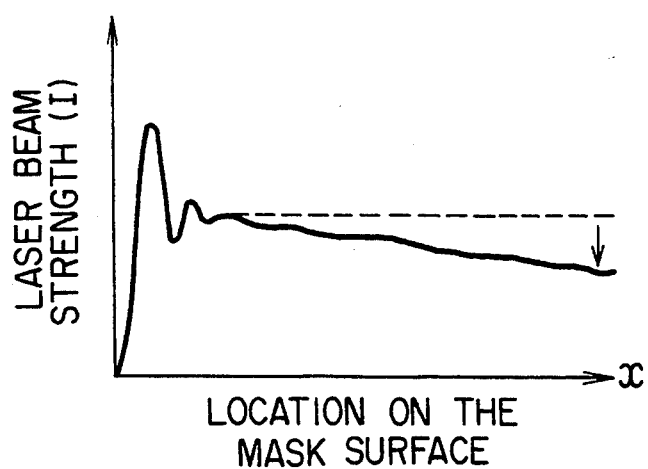
FIG. 18 is a graphical representation showing the distribution of the strength of a laser beam reflected between a mask and a reflecting mirror of FIG. 15 over a surface of the mask.

FIG. 2 illustrates the distribution of the strength of the laser beam 103 on the surface of the mask 101 along the direction of transmission of the laser beam 103. From a comparison between the graphs in FIG. 2 and FIG. 18, it is evident that uniformity in the strength of the laser beam on the mask surface according to the invention is significantly improved in comparison with the previously described apparatus of FIG. 15 in which the reflector 2 is disposed in parallel with the mask 1.

Although in the above embodiment, the angle of inclination $\theta_1$ of the reflecting member 102 is determined by equation (6) above so as to make the energy density of the laser beam 103 at the mask surface as uniform as possible in the direction of laser beam transmission, the energy density of the reflected laser beam can be increased by increasing the absolute value of the angle of inclination $\theta_1$ of the reflector 102.

Figure 4:
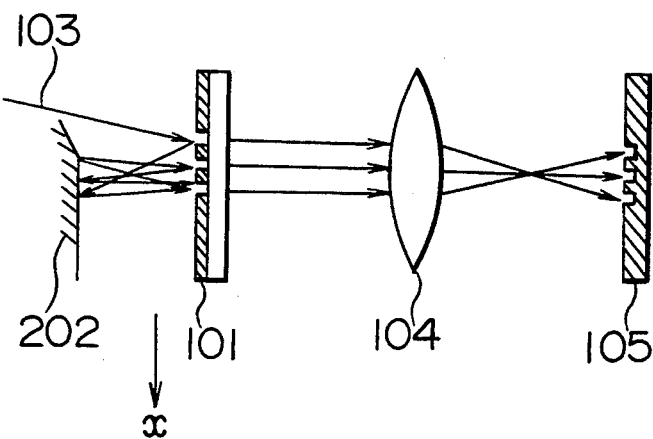
FIG. 4 is a schematic view, similar to FIG. 1, but showing another embodiment of the invention.
Figure 5:
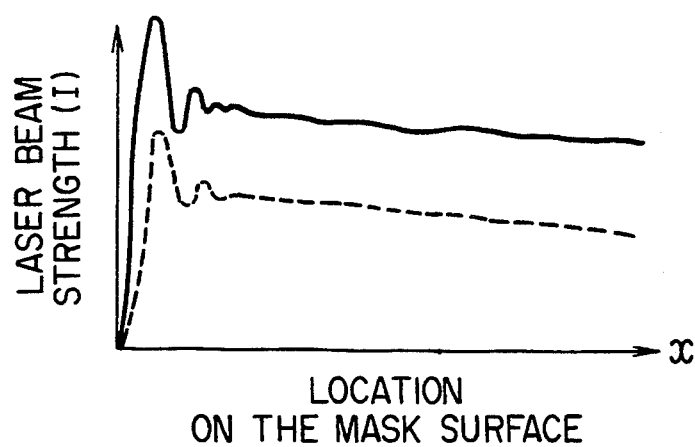
FIG. 5 is a graphical representation showing the distribution of the strength of a laser beam over a surface of a mask of the FIG. 4 embodiment along an X-axis direction.

FIG. 4 illustrates a second embodiment of the invention which is different from the embodiment of FIG. 1 in the construction and arrangement of a reflector 202. Namely, in this embodiment, the reflecting member 202 has a tapered end and it is disposed in a spaced parallel relation with respect to a mask 101. As depicted in detail on an enlarged scale in FIG. 6, the reflecting member 202 has a flat or planar reflecting surface disposed in parallel with the reflecting surface of the mask 101, but has one end thereof tapered in the direction of transmission of a laser beam 103 in such a manner that the tapered surface is disposed at an angle relative to the reflecting surface of the mask 101 with the distance between the tapered surface and the reflecting surface of the mask 101 decreasing in the direction of laser beam transmission between the mask 101 and the reflector 202. With this construction and arrangement of the reflector 202, the laser beam 103 irradiated onto the surface of the mask 101 at an angle relative to the normal to the mask surface is initially reflected between the tapered surface of the reflector 202 and the reflecting surface of the mask 101 in a repeated manner, and during such reflections, the angle of reflection of the laser beam 103 gradually decreases in the direction of laser beam transmission, thus increasing the density of the reflected laser beam 103 in the same direction. Once the laser beam 103 enters a space defined between the parallel-disposed flat reflecting surfaces of the mask 101 and the reflector 202, the angle of reflection of the laser beam 103 becomes constant, so the laser beam 103 transmits while being reflected between the mask 101 and the reflector 202 at the constant reflection angle. As a result, a high energy density of the laser beam 103 can be maintained over the substantially entire surface of the mask 101, thus improving the efficiency in utilization of the laser beam. In addition, if the same level of energy density of a laser beam over the mask surface as in this embodiment is to be obtained with the previously described construction and arrangement (i.e., the non-tapered construction and parallel arrangement) of the reflector 2 of FIG. 15, it is necessary to make the angle of incidence of the laser beam much lesser than that in this embodiment. In this case, a proportion of leakage energy of the laser beam, which is initially reflected from the mask surface and escapes from that end of the reflector 102 at which the laser beam 103 is incident to the mask surface, will increase, thus reducing the available laser energy. Such situations can be clearly seen from FIG. 5 which illustrates the distribution of the laser beam energy over the mask surface in which the solid line represents the embodiment of FIGS. 4 and 6, and the broken line represents the case of FIG. 15. In FIG.

5, the ordinate represents the strength of the laser beam, and the abscissa represents the location or distance from an end of the mask at which the laser beam enters.

Figure 6:
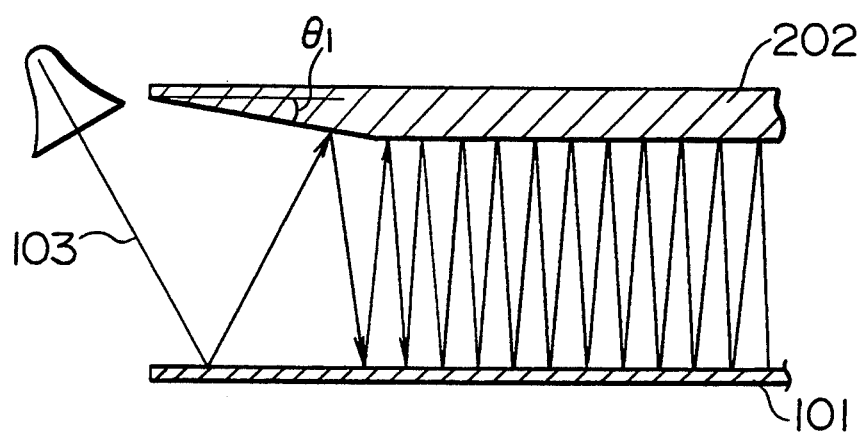
FIG. 6 is an enlarged cross section of parts of the FIG. 4 embodiment, showing the operation thereof.
Figure 7:
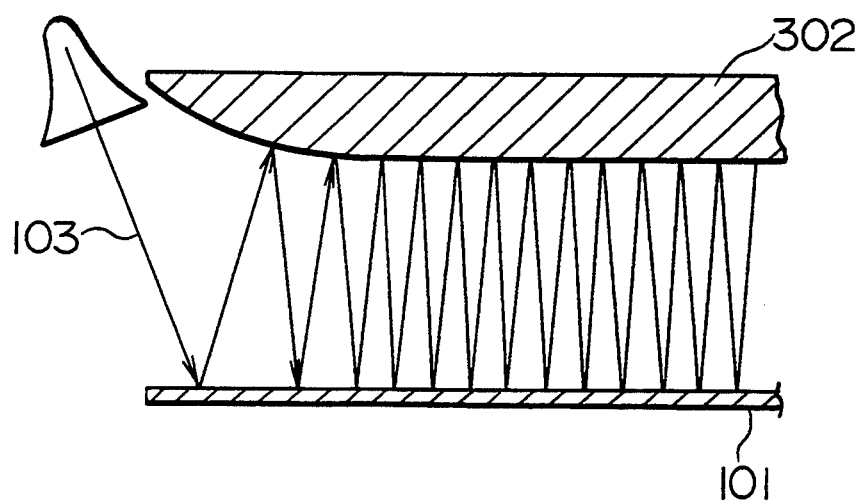
FIG. 7 is a schematic view, similar to FIG. 6, but showing a further embodiment of the invention.

Although in the embodiment of FIGS. 4 and 6, the tapered surface of the reflector 202 is flat with the distance between the mask 101 and the reflector 202 decreasing at a constant rate or slope, it can be a gradually or smoothly curved taper surface or a spherically shaped surface, as shown at 302 in FIG. 7.

Figure 8:
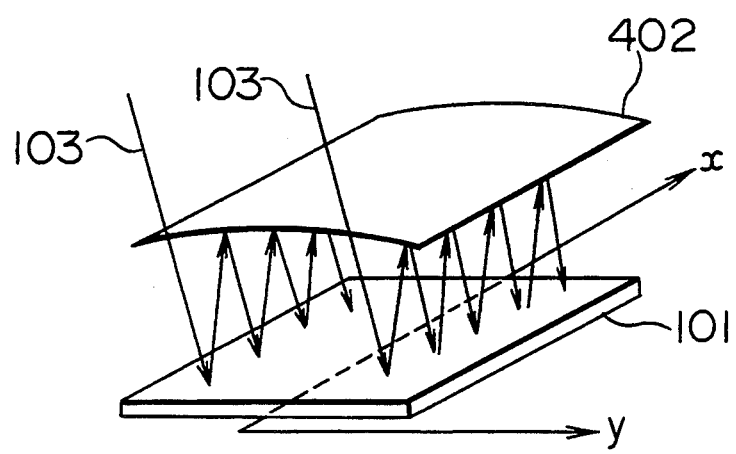
FIG. 8 is a schematic perspective view showing major portions of a yet further embodiment of the invention.
Figure 9:
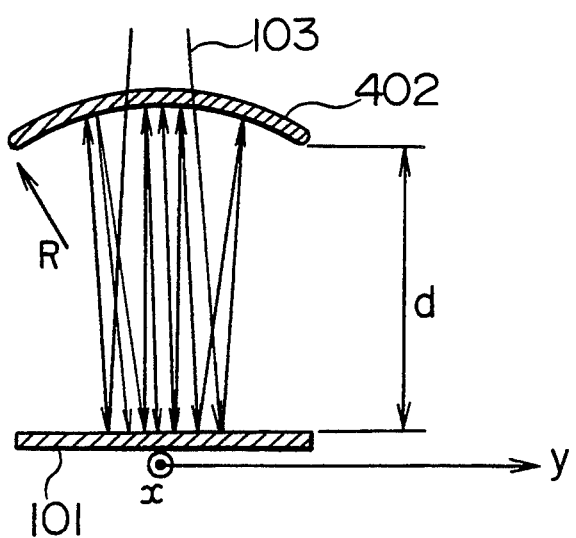
FIG. 9 is a cross sectional view of the embodiment of FIG. 8.

FIGS. 8 and 9 illustrate major portions of an optical processing apparatus in accordance with a further embodiment of the invention. Though not illustrated, a mask 101 of a rectangular configuration has substantially the same construction as that of the mask 1 of the previously described apparatus of FIG. 15. That is, it includes an unillustrated transparent board and an unillustrated masking or reflecting film on a surface of the transparent board, the masking or reflecting film having a prescribed circuit pattern through which a beam of light such as a laser beam can pass. A reflector 402 is disposed at a predetermined distance d from the surface of the mask 101. Though not shown, an optical focusing system such as a lens and a substrate to be processed are disposed at the other side of the mask 101 remote from the reflector 402, substantially in the same manner as in the apparatus of FIG. 15. In this embodiment, the reflector 402 has a substantially rectangular shape in plan similar to the configuration of the mask 101 but a curved cross sectional configuration, as clearly shown in FIG. 9. Specifically, the reflector 402 has a curved mirror or reflecting surface with a radius of curvature R. It is curved in a direction (i.e., a y-axis direction in FIGS. 8 and 9) perpendicular to the direction (i.e., an x-axis direction in FIGS. 8 and 9) in which a beam of light incident from behind the reflector 402 to the mask 101 transmits or proceeds while being repeatedly reflected between the mask 101 and the curved reflector 402. Due to the curved reflecting mirror surface of the reflector 402, the laser beam 103 propagating through a free space between the mask 101 and the reflector 402 while performing repeated reflections therebetween is subject to repeated and alternate divergence and convergence, i.e., it diverges during transmission in the free space between the mask 101 and the reflector 402 and it is also converged by the curved mirror surface of the reflector 402.

Next, the condition for suppressing divergence of the laser beam 103 in the y-axis direction to confine it inside the space between the mask 101 and the reflector 402 is determined based on the theory of transmission of light through a series of lenses.

Figure 10:
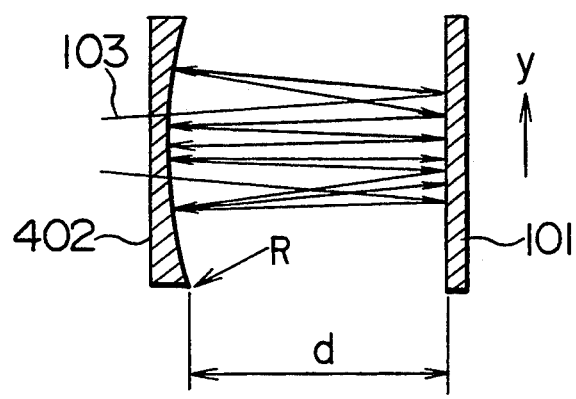
FIGS. 10 through 12 are explanatory views showing the principles of the invention as embodied in the FIGS. 8 and 9 embodiment.
Figure 11:
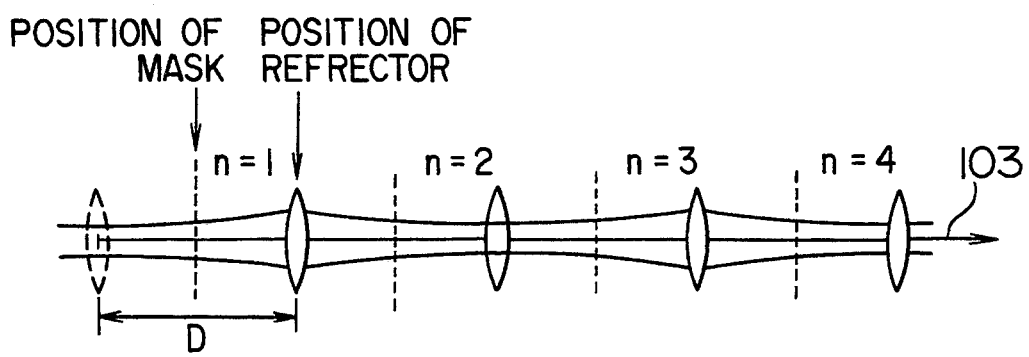
Figure 12:
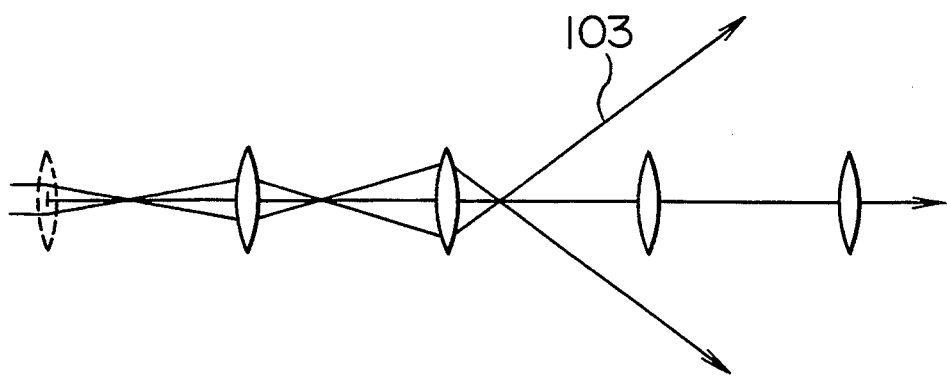

FIGS. 10 through 12 illustrate how to determine such a condition. FIG. 10 illustrates parameters for an optical system comprising the mask 101 and the reflector 402 actually employed in the optical processing apparatus of this embodiment, in which reference character R designates a radius of curvature of the curved mirror surface of the reflector 402 which is curved in a direction (i.e., a y-axis direction in FIG. 10) perpendicular to the direction of transmission of the laser beam 103, and reference character d designates the distance between the flat reflecting surface of the mask 101 and the nearest point in the curved mirror surface of the reflector 402, as measured in a direction perpendicular to the flat reflecting surface of the mask 101.

If it is assumed that each reflection of the laser beam 103 at the curved mirror surface corresponds to each passage through one lens of the laser beam 103, the reflective transmission of the laser beam 103, as shown in FIG. 10, can be replaced by the case in which the laser beam 103 transmits through a series of lenses n (n=1, 2, 3, 4, ...), as depicted in FIG. 11. In this figure, the laser beam 103 successively passes through the series of lenses n (n=1, 2, 3, 4, ...) which are disposed in alignment with respect to each other at equal intervals. In FIG. 11, reference character D designates the distance between two adjacent lenses which is equal to twice the distance d between the mask 1 and the reflector 402. Assuming that the focal distance of each lens is f, then it is established that the radius of curvature R of the curved reflector 402 is equal to twice the focal distance f (i.e., R=2f).

In this regard, it is well known, for example, from a book entitled "Basic Knowledge for Photoelectronics" published by Maruzen Kabushiki Kaisha, page 23, that the condition for allowing a laser beam to transmit through a series of lenses while keeping it under the state of convergence without causing divergence (which is shown in FIG. 12) is given as follows:

$$0 \leq D \leq 4f \tag{7}$$

Using the relations D=2d and R=2f in the above formula, the following relations will be obtained:

$$0 \leq d \leq R \tag{8}$$

Thus, formula (7) above gives the condition for confining the laser beam 103 within the space between the mask 101 and the curved reflector 402, as in the actual arrangement of FIG. 10.

Accordingly, by properly setting the distance between the curved mirror surface of the reflector 402 and the mask 101 to satisfy the above condition, the laser beam 103 is substantially confined within the transverse length of the mask 101 and the reflecting member 102 in the y-axis direction in FIG. 10 (i.e., the direction perpendicular to the direction of transmission of the laser beam 103), so the strength or magnitude of the laser beam 103 can be uniformly distributed over the transverse length of the mask 101. As a result, uniformity in processing a substrate by means of part of the laser beam 103 which has passed through the mask 101 can be accordingly improved.

Figure 13:
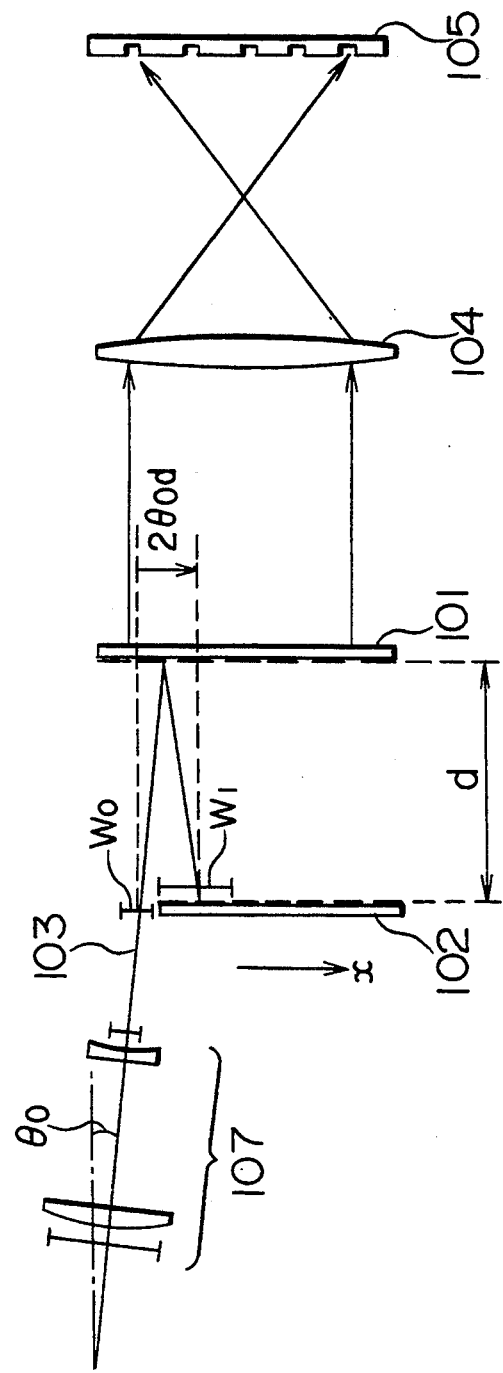
FIG. 13 is a schematic view of a further embodiment of the invention.

FIG. 13 illustrates a further embodiment of the invention which serves to increase the strength or energy of a laser beam over a mask surface even with a reduced angle of incidence of the laser beam while reducing a loss or leakage of laser beam energy at an entrance or incident portion of the mask surface. To this end, an optical beam-shaping system 107 is provided for adjusting the thickness of a laser beam 103, i.e., the laser beam length or dimensions in the direction (i.e., an x-axis direction in FIG. 13) of laser beam transmission. The construction and arrangement of this embodiment other than the above are substantially similar to those of the first embodiment of FIG. 1.

More specifically, as shown in FIG. 13, let us assume that a laser beam 103 having a thickness $W_0$ is irradiated toward the mask 101 from behind the reflector 102 while passing through a location just above one edge (e.g., an upper edge) of the reflector 102 at an angle relative to the normal to the mask surface. The incident laser beam is reflected at the mask surface and reaches the reflector 102. In this case, the laser beam 103 travels a distance of 2d, which is twice the distance d between the mask 101 and the reflecting member 102. Here, supposing that the angle of incidence of the laser beam 103 relative to the normal to the mask surface is $\theta_0$, the center of the laser beam 103 in the thicknesswise direction (i.e., in the direction of transmission of the laser beam) at the surface of reflector 102 moves a distance of $2\theta_0 d$ in the direction of transmission of the laser beam 103 along the surface of the reflector 102 after the laser beam 103 has travelled twice the distance d between the mask 101 and the reflector 102. Let us further assume that the thickness of the laser beam 103 upon its arrival at the surface of the reflector 102 is $W_1$, the condition for directing the entire laser beam 103 reflected at the mask surface toward the reflector 102 without causing any leakage out of the incident or upper edge of the reflector 102 is given below with the assumption that the distance d between the mask 101 and the reflector 102 is great enough in comparison with the dimensions of the thicknesses $W_0$, $W_1$.

$$W_1/2 \leqq 2\theta_0 d - W_0/2 \qquad (9)$$

Formula (9) above is transformed for $\theta_0$ as follows:

$$\theta_0 \geqq (W_0 + W_1)/4d \qquad (10)$$

Since the thickness $W_1$ of the laser beam 103 actually varies in dependence with the distance d, $W_1$ is a function of d and thus formula (10) above can be transformed as follows:

$$\theta_0 \geqq (W_0 + W_1(d))/4d \qquad (11)$$

Figure 14:
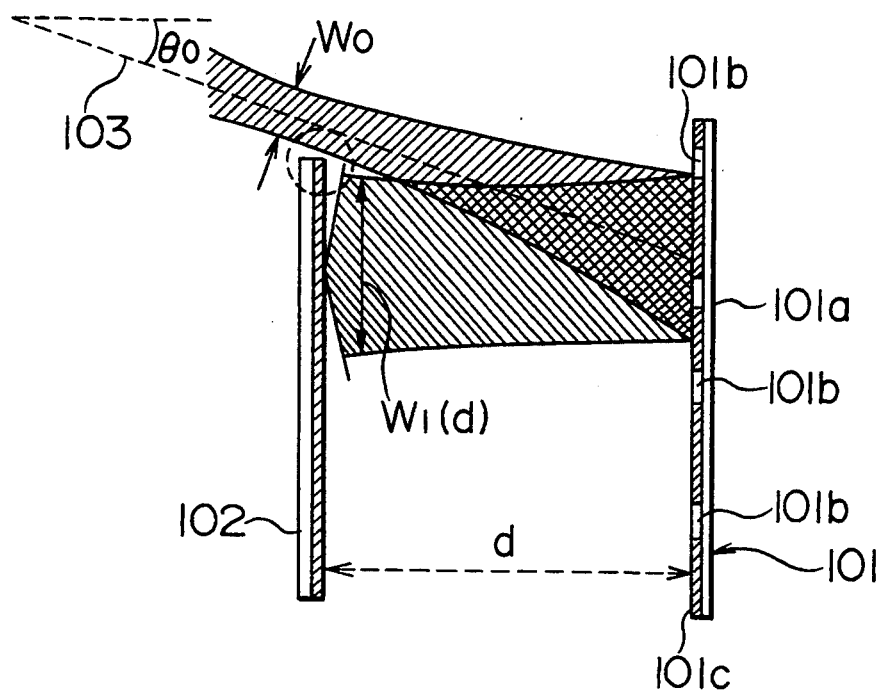
FIG. 14 is an enlarged view of parts of the FIG. 13 embodiment, explaining the operation of the invention.

FIG. 14 illustrates the mode or behavior of the laser beam 103 when the above condition is satisfied, in which an incident laser beam is designated by one hatching and a reflected laser beam is designated by another hatching.

In formula (11) above, the distance d between the mask 101 and the reflector 102 is determined on the basis of the size or dimensions of a circuit pattern 101c formed in a masking or reflecting film 101b of the mask 101. Also, the lesser the angle of incidence $\theta_0$ of the laser beam, the greater the density of the reflected laser beam under multiple reflections, as referred to before with reference to FIG. 15. Therefore, by means of the optical beam-shaping system 107, the thickness of the laser beam 103 is properly adjusted to make the sum of ($W_0$ and $W_1$) to a minimum value, thereby minimizing the angle of incidence $\theta_0$ as much as possible.

Thus, determining a minimum of the incident angle $\theta_0$, which satisfies the above condition, provides an increased strength of the laser beam 103 over the mask surface with a minimum loss of laser beam energy due to an initial reflection, thereby greatly improving the overall optical processing performance of the apparatus.

What is claimed is:

1. An optical processing apparatus comprising:
a light source for generating a beam of light (103);
optical focusing means (104) for focusing the light beam from said light source on an object (105) for optically processing it;
a mask (101) disposed at a location between said light source and said optical focusing means and having a reflecting portion (101c) on one surface thereof for reflecting a portion of the light beam incident from said light source and a light transmitting portion (101b) for allowing the passage therethrough of the remaining portion of the incident light beam toward said optical focusing means; and
a reflector (102) disposed in a spaced face-to-face relation with respect to said mask at said one surface thereof near said light source and having a fully reflecting surface for maximally reflecting the portion of the light beam, which is reflected from the reflecting portion of said mask, back to said mask, said reflecting surface of said reflector being disposed at a predetermined angle of inclination ($\theta_1$) relative to a plane parallel to the reflecting portion of said mask, to thereby enhance the uniformity of the light beam intensity over said one surface of the mask.

2. An optical processing apparatus according to claim 1, wherein said reflector is disposed such that the distance between the reflecting surface of said reflector and the reflecting portion of said mask gradually decreases in a direction in which the light beam incident from said light source to said mask transmits in a space defined between said reflector and said mask while being reflected therebetween.

3. An optical processing apparatus according to claim 2, wherein the angle of inclination $\theta$ of said reflector is given as follows:

$$\theta_1 = \theta_0[(Rr \times Rm)^3 - 1]/[2n + 1 - (Rr \times Rm)^3]$$

where Rm is the factor of reflection of the reflecting portion of said mask: Rr is the factor of reflection of said reflector; n is the number of reflections occurring between said mask and said reflector; and $\theta_0$ is the angle of incidence of the light beam.

4. An optical processing apparatus comprising:
a light source for generating a beam of light;
optical focusing means for focusing the light beam from said light source on an object for optically processing it;
a mask disposed at a location between said light source and said optical focusing means and having a reflecting portion on one surface thereof for reflecting a portion of the light beam incident from said light source and a light transmitting portion for allowing the passage therethrough of the remaining portion of the incident light beam toward said optical focusing means; and
a reflector disposed in a spaced face-to-face relation with respect to said mask at said one surface thereof near said light source and having a fully reflecting surface for maximally reflecting the light beam, which is reflected from the reflecting portion of said mask, back to said mask, said reflecting surface of said reflector including a major parallel portion which is disposed in parallel with respect to the reflecting portion of said mask, and a tapered portion which is connected with the major parallel portion and which is disposed at an angle of inclination relative to a plane parallel to the reflecting portion of said mask, to thereby enhance the density of the light beam over said one surface of the mask.

5. An optical processing apparatus according to claim 4, wherein said tapered portion of said reflector is disposed such that the distance between the tapered portion and the reflecting portion of said mask gradually decreases in a direction in which the light beam incident from said light source to said mask transmits in a space defined between said reflector and said mask while being reflected therebetween.

6. An optical processing apparatus according to claim 5, wherein said tapered portion of said reflector (202) is a flat tapered surface.

7. An optical processing apparatus according to claim 5, wherein said tapered portion of said reflector (302) is a curved tapered surface.

8. An optical processing apparatus according to claim 5, wherein said tapered portion of said reflector (302) is a spherical tapered surface.

9. An optical processing apparatus comprising:
a light source for generating a beam of light;
optical focusing means for focusing the light beam from said light source on an object for optically processing it;
a mask disposed at a location between said light source and said optical focusing means and having a reflecting portion on one surface thereof for reflecting a portion of the light beam incident from said light source and a light transmitting portion for allowing the passage therethrough of the remaining portion of the incident light beam toward said optical focusing means; and
a reflector disposed in a spaced face-to-face relation with respect to said mask at said one surface thereof near said light source and having a fully reflecting surface for maximally reflecting the portion of the light beam, which is reflected from the reflecting portion of said mask, back to said mask, said reflecting surface of said reflector being curved in a direction perpendicular to a direction of transmission of the light beam in which the light beam incident from said light source to said mask transmits in a space defined between said reflector and said mask while being reflected therebetween, to thereby enhance the uniformity of the light beam intensity over said one surface of the mask.

10. An optical processing apparatus according to claim 9, wherein said curved reflecting surface of said reflector has a predetermined radius of curvature R which is equal to or greater than the shortest distance between said reflector and said mask.

11. An optical processing apparatus comprising:
a light source for generating a beam of light;
optical focusing means for focusing the light beam from said light source on an object for optically processing it;
a mask disposed at a location between said light source and said optical focusing means and having a reflecting portion for reflecting a portion of the light beam from said light source and a light transmitting portion for allowing the passage therethrough of the remaining portion of the light beam toward said optical focusing means;
a reflector disposed in a spaced face-to-face relations with respect to said mask at one side thereof near said light source and having a reflecting surface for reflecting the portion of the light beam, which is reflected from the reflecting portion of said mask, back to said mask; and
means for adjusting an angle of incidence of the light beam coming from said light source to said mask in such a manner that a portion of the light beam, which is first reflected from said mask and escapes outwardly from said reflector, is minimized.

12. An optical processing apparatus according to claim 11, wherein an angle of incidence $\theta_0$ of the light beam coming from said light source to said mask is given as follows:

$$\theta_0 = (W_0 + W_1)/4d$$

where $W_0$ is the thickness of the light beam incident to said mask in a direction of transmission of the light beam in which the light beam coming from said light source to said mask transmits in a space defined between said reflector and said mask while being reflected therebetween; $W_1$ is the thickness of light beam at the reflecting surface of said reflector once reflected from said mask in the direction of transmission of the light beam; and d is the distance between said reflector and said mask.

* * * * *